(12) United States Patent
Hazlewood et al.

(10) Patent No.: US 8,231,811 B2
(45) Date of Patent: Jul. 31, 2012

(54) FORMATION OF CONDUCTIVE METAL REGIONS ON SUBSTRATES

(75) Inventors: Shaun Christopher Hazlewood, Suffolk (GB); Natasha Jeremic, Royston (GB)

(73) Assignee: Conductive Inkjet Technology Limited, Ossett (GB)

( * ) Notice: Subject to any disclaimer, the term of this patent is extended or adjusted under 35 U.S.C. 154(b) by 383 days.

(21) Appl. No.: 12/374,679

(22) PCT Filed: Jul. 19, 2007

(86) PCT No.: PCT/GB2007/002762
§ 371 (c)(1),
(2), (4) Date: Apr. 2, 2009

(87) PCT Pub. No.: WO2008/012512
PCT Pub. Date: Jan. 31, 2008

(65) Prior Publication Data
US 2009/0181227 A1    Jul. 16, 2009

Related U.S. Application Data

(60) Provisional application No. 60/832,598, filed on Jul. 24, 2006.

(30) Foreign Application Priority Data

Jul. 22, 2006 (GB) .................................. 0614573.4

(51) Int. Cl.
- H01B 1/02    (2006.01)
- H01B 1/12    (2006.01)
- H01B 1/22    (2006.01)
- H01B 1/08    (2006.01)
- H01B 1/00    (2006.01)

(52) U.S. Cl. ...................... 252/518.1; 252/512; 252/513; 252/514; 252/519.2; 252/519.21; 252/500

(58) Field of Classification Search .................. 252/512, 252/513, 514, 519.2, 519.21, 500, 518.1
See application file for complete search history.

(56) References Cited

U.S. PATENT DOCUMENTS

| 5,980,813 | A   | * | 11/1999 | Narang et al. | 264/401 |
|---|---|---|---|---|---|
| 6,399,282 | B1 | * | 6/2002 | Kubota et al. | 430/311 |
| 6,433,038 | B1 | * | 8/2002 | Tanabe et al. | 522/84 |
| 6,586,038 | B1 | * | 7/2003 | Chabrecek et al. | 427/2.24 |
| 8,071,665 | B2 | * | 12/2011 | Hazlewood et al. | 523/160 |
| 2004/0259758 | A1 | * | 12/2004 | Rodrigues et al. | 510/475 |
| 2005/0022692 | A1 |   | 2/2005 | Eu et al. | 106/1.11 |
| 2005/0130397 | A1 |   | 6/2005 | Bentley et al. | 438/584 |
| 2006/0001726 | A1 | * | 1/2006 | Kodas et al. | 347/105 |

FOREIGN PATENT DOCUMENTS

| WO | WO0010736 | * | 3/2000 |
|---|---|---|---|
| WO | WO2004/068389 A2 | * | 8/2004 |
| WO | WO2006/038011 | * | 4/2006 |
| WO | WO 2006/038011 A2 |   | 4/2006 |

OTHER PUBLICATIONS

A. Traction (CRC Press Taylor and Francis LLC Boca Raton FL USA Chapt 15 pp. 15-1 2007 reprint from 2006).*
Chemical Book (15625-89-5 Trimethylolpropane triacrylate Product Description, synonyms, (C) 2007) {http://us.chemicalbook.com/ChemicalProductProperty_US_CB1215942.aspx}.*

* cited by examiner

Primary Examiner — Aaron Greso
(74) Attorney, Agent, or Firm — Morgan, Lewis & Bockius LLP

(57) ABSTRACT

An activator composition for forming an activator-containing region on a substrate for activating a chemical reaction to form a conductive metal region on the substrate, the composition being suitable for thermal inkjet printing, the composition comprising a single phase aqueous composition including one or more curable materials and one or more co-solvents for the curable material(s); and an activator for reaction to form a conductive metal region. Conductive metal regions may be formed on the resulting activator-containing regions by a metallisation reaction such as electroless deposition.

20 Claims, No Drawings

US 8,231,811 B2

FORMATION OF CONDUCTIVE METAL REGIONS ON SUBSTRATES

This application is a 371 filing of PCT/GB2007/002762 (WO 2008/012512), filed Jul. 19, 2007, claiming priority benefit of GB 0614573.4, filed Jul. 22, 2006, and U.S. Provisional Application No. 60/832,598, filed Jul. 24, 2006. The benefit of each of said earlier filings is claimed.

The present invention relates to the formation of conductive metal regions on substrates, and concerns an activator composition for forming an activator-containing region on a substrate, and a method of forming a conductive metal region on a substrate using such an activator-containing region.

BACKGROUND TO THE INVENTION

There are many industrial applications using conductive metal regions on substrates, many of which require the conductive metal regions to be formed according to a pattern. An important application is the manufacture of printed circuit boards, where metal layers are formed into a pattern on a substrate to connect electrically different components and electrical devices according to a predetermined arrangement. Other applications include aerials and antennae, such as those found in mobile telephones, radio frequency identification devices (RFIDs), smart cards, contacts for batteries and power supplies, arrays of contacts for flat screen technologies (liquid crystal displays, light emitting polymer displays and the like), electrodes for biological and electrochemical sensors, smart textiles, conductors used in displays, heater elements, interconnects and decorative features. In many of these applications it is important to be able to control closely the size and form of the conductive metal regions. In most of these applications, the metal region must be conductive and a high level of conductivity is desirable, or in some cases essential. In addition close control over the physical properties of the metal regions, e.g. accurate reproducibility of resistance, may be important.

It is known to form conductive metal regions on substrates by the reduction of metal ions. This is the basis of the so-called "electroless" plating or deposition procedure in which an activator such as a catalyst or catalyst precursor is applied to a substrate which is then immersed in a succession of baths. One of the baths comprises a metal ion (e.g. a copper salt), a reducing agent (e.g. formaldehyde) and a base to activate the formaldehyde (e.g. sodium hydroxide). The metal ion is reduced to form a conductive metal region on the substrate surface, where the activator has been applied.

WO 2004/068389 (Conductive Inkjet Technology Limited) proposes an alternative to immersion procedures, in which metal ion and reducing agent are deposited together on a substrate, preferably by inkjet printing, and react in situ, in the presence of an activator, to form a conductive metal region.

WO 2005/045095 and WO 2005/056875 (both of Conductive Inkjet Technology Limited) disclose piezoelectric inkjet printing on a substrate of non-aqueous mixtures of ultra-violet (UV)-curable monomers and oligomers together with palladium acetate activator (catalyst precursor) to form an activator-containing region on the substrate, and subsequent reaction, e.g. by electroless deposition, to produce conductive copper regions on the substrate.

Use of inkjet printing for deposition of activator enables close control over the size and form of activator on a substrate, and hence of the size and form of the resulting metal regions.

WO 2005/010108 (Hewlett-Packard) discloses inkjet printing of non-curable compositions including palladium aliphatic complexes for catalysing electroless deposition of copper.

Inkjet printing processes fall into two main types: continuous processes and drop-on-demand (DOD) processes. Continuous processes use electrically conductive inks to produce a stream of drops of electrically charged ink that are deflected by an electric field to an appropriate location on a substrate. In DOD processes, individual drops of ink are expelled from the nozzle of a print head either by vibration of a piezoelectric actuator (in piezoelectric inkjet printing) or by heating the ink to form a bubble (in thermal inkjet printing, also known as bubble jet printing). Thermal inkjet printing has advantages over piezoelectric inkjet printing, with printers and print heads being lower cost and with the printing process being able to achieve better resolution.

Inkjet inks need to satisfy a number of requirements, including the following:

Viscosity must be appropriate. With DOD inks there are greater limitations on inks for thermal printing than for piezoelectric printing, with it generally being necessary for inks to have a viscosity of below about 4 mPas at print head operating temperature (which is typically 40-50° C.), which usually equates to a viscosity of less than 6.5 mPa.s at room temperature (25° C.), to be capable of being thermally inkjet printed. In this specification, all viscosity values are at 25° C. unless otherwise specified.

The ink must not cause unacceptable levels of clogging or blockage of printing nozzles.

The ink must not result in build up of deposits on the ejection heaters of thermal inkjet print heads (a process known as "kogation") to an unacceptable level during the working life of a print head.

The ink should be stable in storage, without settling out or coagulation of materials.

Curable DOD inks are known. These typically comprise one or more monomers etc. curable in response to appropriate conditions, typically ultra violet (UV), infra red (IR) or heat.

U.S. Pat. No. 5,623,001 (Scitex) discloses UV-curable DOD inkjet inks, particularly for piezoelectic printing, comprising water (20-75%) and water-miscible UV-curable monomer and/or oligomer e.g. acrylic materials (20-60%). The document makes no reference to thermal inkjet printing, and does not teach how to produce inks with a viscosity of less than 6.5 mPas, suitable for thermal inkjet printing, nor does it teach how to prevent kogation.

U.S. Pat. No. 5,952,401 (Canon) discloses curable water-based inks for piezoelectric and bubble jet printing using curable monomers. The document does not address the issue of prevention of kogation caused by curable materials.

U.S. Pat. No. 6,294,592 (BASF) discloses curable inkjet inks exemplified by UV-curable polyurethane dispersions. The document does not address issues of viscosity or prevention of kogation None of the above three documents discloses use of inkjet inks as a vehicle for carrying an activator.

Curable monomers and oligomers tend to have limited solubility/miscibility in water, and substantial practical difficulties arise in producing water-based inks with sufficiently low viscosity (below 6.5 mPa·s) to be useful for thermal inkjet printing that do not undergo undesirable phase separation, do not cause clogging or blockage of printing nozzles, and that do not result in unacceptable levels of kogation.

We have found that by use of appropriate curable material(s) together with water-compatible solvent (referred to as a co-solvent) for the curable material(s) it is possible to produce low viscosity compositions suitable for thermal inkjet printing. These compositions can be used as a vehicle for carrying activator, enabling inkjet printing of an activator on a substrate for subsequent reaction to form a conductive metal region, the size and form of which can be readily regulated.

SUMMARY OF THE INVENTION

In one aspect, the present invention provides an activator composition for forming an activator-containing region on a substrate for activating a chemical reaction to form a conductive metal region on the substrate, the composition being suitable for thermal inkjet printing, the composition comprising a single phase aqueous composition including one or more curable materials and one or more co-solvents for the curable material(s); and an activator for reaction to form a conductive metal region.

The activator composition is suitable for thermal inkjet printing and so generally has a viscosity of less than 6.5 mPa·s (at 25° C.). Nevertheless, we have been able to produce compositions in accordance with the invention with viscosities as high as 12 mPa·s that are capable of being thermally inkjet printed, although lower viscosities are preferred. The activator composition thus preferably has a viscosity not exceeding 12 mPa·s, more preferably less than 8 mPa·s, yet more preferably less than 6.5 mPa·s and even more preferably less than 6 mPa·s. All viscosities are as measured using a Brookfield DV-II+ viscometer operating with a rotational speed of 60 rpm at a temperature of 25° C.

The term "single phase" is used to mean that the curable material(s) are fully in solution, being dissolved in water and co-solvent or being fully miscible therewith. No phase separation or settlement occurs. The single phase composition may nevertheless possibly carry other materials in solid form.

The curable material(s) can undergo a chemical change resulting in hardening, preferably solidification. The hardening process improves adhesion of the material to the substrate and results in formation of a solid region on the substrate that may be rigid, plastic, elastic, resilient, gelatinous, permeable or have any other property consistent with being in the solid phase, as opposed to liquid or gas. The solid region may include regions in liquid or gaseous form.

The curable material(s) are such that the resulting solid region adheres to the substrate, and so may be selected having regard to the substrate. Adhesion can arise through chemical bonding, physical bonding, mechanical bonding or a mixture thereof.

The activator composition is brought into contact with the substrate surface while the composition is in liquid form, and is subsequently caused or allowed to cure. Curing typically takes place while the composition is still in liquid form, although the composition may instead be converted to solid form, e.g. by drying, prior to curing.

The activator is typically incorporated in the resulting solid region, whether by entrapment, immobilisation or other means, and is typically dispersed throughout the solid region within a matrix formed by the cured composition. The activator is thus adhered with respect to the substrate by virtue of its inclusion in the region.

The curable material(s) typically comprise one or more monomers and/or oligomers which can polymerise and/or cross-link in use, thereby hardening and forming a solid region on the substrate. Preferably, the resulting product forms a matrix, typically a polymer matrix, which includes the activator. A curable composition including at least some oligomers will often have lower toxicity than if only monomers were included. The presence of at least some oligomers can also result in production of a region having improved physical properties such as flexibility, hardness and abrasion-resistance.

The curable material(s) are curable in response to appropriate curing conditions. For example, the composition may be curable in response to a stimulus, such as electromagnetic radiation of a particular wavelength band (e.g. ultra-violet, blue, microwaves, infra-red), electron beams, or heat. The material(s) could instead be curable in response to appropriate chemical conditions, particularly the presence of a chemical curing agent or hardener. As a further possibility the material(s) may be curable in response to the presence of species such as moisture or air. Preferably, the curable material(s) are selected to undergo a reaction responsive to one or more of the above stimuli. UV-curable materials are currently preferred.

The curable material(s) preferably include one or more curable oligomers.

The curable oligomers preferably include one or more alkoxylated trimethylolpropane acrylates. These are suitably present in an amount in the range 1-10%, preferably 3-6% by weight or the weight of the composition.

The curable oligomers preferably include one or more polyalkene glycol acrylates. These are suitably present in an amount in the range 3-15%, preferably 4-10% by weight of the weight of the composition.

It is preferred to use a mixture of at least two curable oligomers. The two oligomers are preferably chemically distinct, being from different chemical classes, rather than being different grades of the same material, e.g. having different chain lengths, molecular weights etc.

Good results have been obtained using a mixture of at least one alkoxylated trimethylolpropane acrylate and at least one polyalkene glycol acrylate. Oligomers in the first class have reasonable water solubility and produce printed regions with good properties, e.g. in terms of hardness and water resistance, but they have relatively high viscosities. Oligomers in the second class have higher water solubility and lower viscosity, but produce softer, more water sensitive regions. By using a mixture of the two classes of oligomers, a good overall balance of properties can be achieved.

The alkoxylated tritnethylolpropane acrylate oligomer includes acrylates, methacrylates, and also multifunctional (meth)acrylates including di(meth)acrylates, tri(meth)acrylates etc. The number of functionalities affects the properties of the resulting cured regions, with higher functionality materials producing regions with higher shrinkage, higher water/chemical resistance and better durability. Higher functionality also provides fast cure response: materials with 2 or 1 functional group usually cure/polymerise slowly and require a greater ratio of initiator and longer exposure to curing conditions. Some of the disadvantages of materials with very high functionality (5 or higher) are that they have high viscosity and they produce regions with very high shrinkage and low flexibility. Materials with 4 functionalities increase cross linking density, and chemical resistance and scratch resistance of printed regions, but have high viscosities and so should be used sparingly (typically at 1-2% by weight). Tri(meth)acrylates are currently preferred for their balance of properties.

The alkoxylated trimethylolpropane acrylate oligomer may be ethoxylated, propoxylated etc, with ethoxylated oligomers generally being preferred as they have greater water solubility. The extent of alkoxylation affects the water solubility of the oligomer, and also the water sensitivity of the resulting printed material, with higher levels of alkoxylation producing more water soluble oligomers and more water sensitive prints. It is preferred to use a material with 20 ethylene oxide units (20 EO), possibly in combination with smaller amounts of material with lower levels of ethoxylation, for a good balance of properties.

Good results have been obtained with ethoxylated (20 EO) trimethylolpropane triacrylate (TMPTA). This material has good water solubility, fast cure response and low skin irritancy and produces printed regions with good properties including good water and solvent resistance and lack of brittleness, i.e. good ductility.

Suitable commercially available materials include the following UV-curable materials available from Sartomer: SR 415 (EO 20 TMPTA), CN 435 and SR 9015 (EO 15 TMPTA). A useful multifunctional material in this class is SR 494 (EO 4 pentaerythritol tetraacrylate—EO 4 PETA).

Good results have been obtained with a mixture of between 3 and 4%, e.g. 3.6%, by weight EO 20 TMPTA (SR 415) and about 1% by weight EO 4 PETA (SR 494).

The polyalkene glycol acrylate oligomer includes acrylates, methacrylates and also multifunctional (meth)acrylates, including di(meth)acrylates, tri(meth)acrylates etc. Diacrylates are currently preferred. Compared with diacrylates, methacrylates and dimethacrylates have lower viscosities (which is advantageous), but slower cure responses (which is disadvantageous). The polyalkene may be polyethylene, polypropylene etc, with polyethylene glycols being favoured. The currently preferred material is thus polyethylene glycol diacrylate (PEG DA). PEG DA is available in a range of different grades having different molecular weights. The preferred material is PEG 400 DA (e.g. in the form of SR 344 from Sartomer) taking into account factors such as water solubility, viscosity and cure response speed. PEG 200 DA (e.g. SR 259 from Sartomer) has lower viscosity than PEG 400 DA (because of the lower molecular weight) but it has the disadvantages of having lower water solubility and of being less stable and so having a shorter shelf life. PEG 600 DA (e.g. SR 610 from Sartomer) is completely water miscible and results in very flexible printed regions. Disadvantages of PEG 600 DA are higher viscosity and higher water sensitivity of the printed regions compared to PEG 400 DA and PEG 200 DA.

Good results have been obtained with compositions including between 7 and 8%, e.g. 7.3%, by weight PEG 400 DA (SR 344).

Multifunctional oligomers may optionally be included in the composition in small amounts (typically 1-2% by weight and not more than 4% by weight as they have high viscosities) in order to increase cross linking density and improve reactivity and scratch resistance of resulting regions. Possible materials of this sort include:

pentaerythritol tetraacrylate (PETA) (e.g. SR 295 from Sartomer). This material has high viscosity. It is also a solid at room temperature so it significantly increases the viscosity of the composition, affecting its jettability.

dimethylolpropane tetraacrylate (DMPTA) (e.g. SR 355 from Sartomer). This imparts excellent properties to cured regions, but has high viscosity.

dipentaerythritol pentaacrylate (DPEPA) (e.g. SR 399 from Sartomer). This is hydrophilic but very viscous. It significantly improves water fastness of printed regions but advesely affects composition viscosity.

EO pentaerythritol tetraacrylate (PETA) (e.g. SR 494 from Sartomer) as referred to above. This provides a good compromise between reactivity, multifunctionality, chemical resistance, water fastness and viscosity.

The curable material(s) desirably include one or more curable monomer materials. These generally have low viscosities, and so act to reduce the viscosity of the composition. They act as curable humectants, helping jetting stability and printing reliability and preventing drying on the nozzles. They cure in with the oligomers, if present, increasing thickness of printed regions. Because they cure in with the oligomers they do not have to be removed from the print before or after curing. It is preferred to use an n-vinyl monomer material, preferably n-vinyl acetamide (N-VAM), as this is found to give good results. N-vinyl pyrrolidone (NVP) is also useful, but is desirably avoided for health and safety reasons. Other possibilities include n-methyl-n-vinyl acetamide. N-acryloyl morpholine (N-AM) (which is also curable) is a useful material in combination with an n-vinyl monomer material. The combination of n-vinyl acetamide and n-acryloyl morpholine has been found to give good results. The curable monomer material, particularly n-vinyl materials, may also function as co-solvent. The n-vinyl monomers are also surprisingly found to be useful in preventing or reducing kogation, and so function as anti-kogation agents. The monomer material may be used in an amount of up to about 40% by weight of the total weight of the composition, but is typically used at levels of 25% or less.

For example, good results have been obtained with mixtures of between 5 and 6%, e.g. 5.2%, by weight n-vinyl acetamide and between 5 and 6%, e.g. 5.2%, by weight n-acryloyl morpholine in combination with other material(s) functioning solely as co-solvent (to be discussed below).

Viscosity values for various UV-curable materials (obtained from the suppliers of the materials) are given in the table below.

| Commercial name | Chemical name | Viscosity (mPa · s) @ 25° C. | |
|---|---|---|---|
| | | Range | Precise |
| SR 252 | PEG (600) DM | 55-85 | 70 |
| SR 259 | PEG (200) DA | 15-35 | 25 |
| SR 295 | PETA | 200-500 @ 38° C. | 350 @ 38° C. |
| SR 344 | PEG (400) DA | 40-75 | 60 |
| SR 355 | DMPTA | 450-900 | 700 |
| SR 399 | DPEPA | 7000-21000 | 14000 |
| CN 435 or SR 9015 | EO 15 TMPTA | 100-240 | 170 |
| SR 415 | EO 20 TMPTA | 150-300 | 230 |
| SR 494 | EO 4 PETA | 100-200 | 150 |
| CD 550 | Methoxy PEG (350) MM | 28 | 22 |
| CD 552 | Methoxy PEG (550) MM | 39 | 39 |
| SR 603 OP | PEG (400) DM | 20-70 | 45 |
| SR 604 | PPG MM | 25-40 | 33 |
| SR 610 | PEG (600) DA | 50-110 | 80 |
| NVP | N-vinyl pyrrolidone | 2.4 @ 20° C. | 2.4 @ 20° C. |
| NAM | N-acryloyl morpholine | 12 | 12 |
| NVC | N-vinyl caprolactam | solid | solid |
| HEMA | (2-hydroxyethyl methacrylate) 2-(2-ethoxyethoxy)ethyl acrylate | 5 | 5 |

The co-solvent functions as a solvent for the curable material(s). The co-solvent ideally has good compatibility with water and low viscosity. The co-solvent is typically selected from water-soluble organic solvents including alcohols, thiols, ethers etc. Glycol ethers function well as co-solvents, as they have good water compatibility, low viscosities and high boiling points. Further, glycol ethers function as humectants, preventing drying in print head nozzles. Ethylene glycol monobutyl ether (EGMBE) is particularly preferred. A non-exhaustive list of possible co-solvents includes the following: isopropyl alcohol (IPA) (which gives good jetting), n-methyl pyrrolidone (NMP), methoxy propyl acetate (MPA) (which has a low viscosity), diacetone alcohol (DAA), methoxy propanol (MeOPr), methyl alcohol, ethyl alcohol, methyl lactate, ethyl lactate, 2-pyrrolidone, 1,4 butanediol, dimethyl sulphoxide (DMSO), glycol ethers, particularly propylene glycol n-butyl ether, dipropylene glycol, tripropylene glycol, 2-methyl-1,3-propanediol, propylene glycol methyl ether, propylene glycol ethyl ether, dipropylene glycol methyl ether, dipropylene glycol n-butyl ether, tripropylene glycol methyl ether, tripropylene glycol n-butyl ether, propylene glycol methyl ether acetate, dipropylene glycol methyl ether acetate, propylene glycol n-propyl ether, dipropylene glycol n-propyl ether, ethylene glycol n-butyl ether (or ethylene glycol monobutyl ether (EGMBE)), diethylene glycol n-butyl ether, triethylene glycol butyl ether, diethylene glycol methyl ether, triethylene glycol methyl ether.

As noted above, certain curable monomers may also function as co-solvents, e.g. n-vinyl monomer materials such as n-vinyl acetamide, n-vinyl pyrrolidone, n-methyl-n-vinyl acetamide, etc., and also n-acryloyl morpholine.

In one particular embodiment of the invention, the composition includes a co-solvent which does not also function as a curable monomer material. Such a co-solvent may be used in conjunction with a curable monomer material.

Examples of non-curable co-solvents include EGMBE, NMP, IPA etc, as listed above.

Mixtures of materials may be used as the co-solvent. One preferred co-solvent comprises a mixture of n-acryloyl morpholine (which is curable, has a high boiling point and reasonable viscosity), n-vinyl acetamide, ethylene glycol monobutyl ether (EGMBE) and isopropyl alcohol. The n-acryloyl morpholine is conveniently present in an amount of between 5 and 6%, e.g. 5.2%, of the weight of the composition, the n-vinyl acetamide is conveniently present in an amount between 5 and 6%, e.g. 5.2%, of the weight of the composition, the EGMBE comprises between 16 and 17%, e.g. 16.6%, of the weight of the composition and the isopropyl alcohol comprises between 3 and 4%, e.g. 3.1%, of the weight of the composition.

The co-solvent is typically present in an amount in the range 15 to 35% by weight of the total weight of the composition.

The composition optionally includes surfactant in small amount (say up to 1% by weight) to improve wetting. Suitable surfactants can be selected having regard to the substrate on which the composition is to be printed. Suitable surfactants include the following:

| Commercial name | Chemical name | Supplier |
| --- | --- | --- |
| BYK 333 | Polyether modified poly-dimethyl-siloxane | BYK Chemie GmbH |
| BYK 381 | Ionic solution of polyacrylic copolymer | BYK Chemie GmbH |
| FC 4430 | Fluorosurfactant | 3M |
| FC 4432 | Fluorosurfactant | 3M |
| Dynol 604 | Non-ionic acetylenic glycol-based surfactant | Air Products |
| Surfadone LP 100 | N-alkyl pyrrolidone | ISP |

Fluorosurfactants e.g. FC 4430 and FC 4432, e.g. in an amount of 0.2% by weight, are currently favoured.

The composition typically includes a suitable initiator appropriate to the curable materials, e.g. a thermal initiator, photoinitiator etc. Suitable initiators are well known to those skilled in the art, as are suitable levels of use (typically less than about 5% by weight). Examples of photoinitiators include Irgacure 2959Irgacure 184, 651, 1700, 1800, 819 (Ciba), Darocure 173 etc. (Irgacure and Darocure are Trade Marks). Examples of thermal initiators include VA 044 (2,2'-azobis [2-(2-imidazolin-2-yl) propane] dihydrochloride), VA 057 (2,2'-azobis[N-(2-carboxyethyl)-2-methyl-propionamidine]) from Wako Chemicals. Some curable materials will cure without the presence of an initiator, e.g. in response to exposure to an electron beam (known as e-beam curing).

The composition also includes water, usually in an amount of at least about 10% by weight, although it is generally preferred to use higher concentrations of water, preferably at least about 25% by weight, more preferably at least about 35% by weight, yet more preferably at least about 40% by weight, and more typically at least about 45% by weight.

The composition may include an optional stabiliser such as methylhydroquinone.

The activator typically comprises a catalyst or catalyst precursor, and is conveniently a salt or complex of a conductive metal, preferably a salt of a transition metal, particularly palladium, platinum or silver. The salt may be inorganic, such as palladium chloride, or organic, such as palladium acetate or palladium propanoate.

One preferred activator is palladium acetate, which is a catalyst precursor. Palladium acetate is a precursor of palladium, which is a catalyst in metallisation reactions. Palladium acetate may be converted to an active or catalytic form by reduction iii situ in the activator-containing region on the substrate, e.g. by subsequent application of a reducing agent, conveniently an aqueous solution of dimethylarnine borane (DMAB) to form palladium metal. The resulting palladium metal can catalyse deposition of metal thereon on appropriate subsequent treatment, to be discussed below.

The activator is suitably present in the activator composition in an amount in the range 1 to 3% by weight of the composition.

Many palladium salts are insoluble in water, so it is preferred to use palladium salts, e.g. palladium acetate, in the form of a water-soluble complex. One preferred complexing agent is ammonium hydroxide (a solution of ammonia in water). Another possible complexing agent is ethylenediaminetetraacetic acid (EDTA) di- or tetra-sodium salt, with the tetra-sodium salt being preferred for its better water solubility.

A palladium salt complex is conveniently made by dissolving the palladium salt, e.g. palladium acetate, in water (e.g. 5% by wt of palladium salt) and adding the complexing agent. The complexing agent should be used at a minimum molar ratio of complexing agent: palladium salt of at least 2:1.

The palladium salt is typically present in the activator composition in an amount in the range 0.5 to 3%, preferably 0.8 to 1.2% by weight.

Alternative activators include other palladium salts, complexes or colloids; salts, complexes or colloids of other transition metals; and metal particles such as particles of bronze, aluminum, gold or copper.

A mixture of activators may be used.

The activator may be present in the activator composition in solution or as a dispersion (being dissolved or dispersed in the single phase aqueous composition) or as a mixture of these states, subject to the activator composition having suitable properties for thermal inkjet printing. It is generally preferred that the activator is in solution, so that the activator composition is also in the form of a single phase aqueous composition.

The compositions of the invention are suitable for application to a substrate using a thermal inkjet printer. In use the compositions are printed onto the intended substrate and exposed to an appropriate curing regime depending on the nature of the curable materials, e.g. involving exposure to UV light, heat etc, resulting in production of an activator-containing region on the substrate. A drying step may also be required, e.g. using exposure to microwaves. For UV-curable materials we have found it can be beneficial to precede curing with a brief drying step, e.g. by exposure to an infra red source, as this has been found to produce films with improved wet-fastness and durability.

The activator-containing region may coat most or all of the entire substrate surface. Typically, however, the region will be formed on the substrate according to a pattern by printing in the desired pattern. The pattern will commonly be an arrangement of tracks corresponding to a desired pattern of conductive metal tracks to be formed thereon. Alternatively, the activator-containing region may be patterned after the activator composition has been applied, for instance as disclosed in WO 2005/056875.

The activator-containing region typically has a thickness greater than 300 nm and possibly significantly thicker.

In use, the activator composition is applied to a surface of the substrate by thermal inkjet printing. The resulting activator-containing region is then used to activate a chemical reaction to produce a layer of conductive metal on the substrate surface. Typically this involves contact with one or more further liquids.

Thus in a further aspect, the invention provides a method of forming a conductive metal region on a substrate, comprising thermally inkjet printing a composition in accordance with the invention onto a substrate to produce an activator-containing region on the substrate; and applying one or more liquids to the region for chemical reaction, activated by the activator, to form a conductive metal region on the substrate.

The curable materials are generally caused or allowed to cure, e.g. by exposure to UV, prior to application of the one or more further liquids, so that the activator-containing region is in solid condition.

A drying step may also be required, e.g. using exposure to microwaves. For UV-curable materials we have found it can be beneficial to precede curing with a brief drying step, e.g. by exposure to an infra red source, as this has been found to produce films with improved wet-fastness and durability.

The further liquid or liquids may be applied by a variety of techniques including deposition techniques, e.g. printing, and immersion techniques.

A conductive metal layer is typically formed by the reduction of metal ions in a reaction involving an activator (catalyst), a metal ion and a reducing agent. A variety of different techniques may be used, including electroless deposition and the process disclosed in WO 2004/068389. The activator is deposited on a substrate by inkjet printing, and other necessary reagents deposited (by inkjet printing, immersion or otherwise) in one or more further liquids, resulting in reaction to form a conductive metal layer on the substrate. Further details of suitable techniques are given in WO 2004/068389, WO 2005/045095, WO 2005/056875 and WO 2005/010108.

Immersion processes are generally favoured, for reasons of reliability, simplicity and efficiency.

The metal ion may be an ion of any conductive metal, particularly a transition group metal. Preferable conductive metals include copper, nickel, silver, gold, cobalt, a platinum group metal, or an alloy of two or more of these materials. The conductive metal may include non-metallic elements, for example, the conductive metal may be nickel-phosphorus alloy.

The metal ion is typically in the form of a salt, for example copper sulphate. The metal ion might instead be present in a complex such as with EDTA (ethylenediaminetetraacetic acid) or cyanide.

Examples of appropriate reducing agents are formaldehyde, most other aldehydes, glucose, sodium hypophosphites, glyoxylic acid and DMAB (dimethylamine borane).

In one preferred embodiment, an activator composition including one or more UV-curable materials and palladium acetate is deposited on a substrate by thermal inkjet printing. After curing by exposure to UV, the substrate is immersed in a bath of a weak aqueous solution of DMAB under suitable conditions to reduce the palladium acetate to palladium (e.g. 10 to 20 seconds at room temperature (about 25° C.)). After washing, the substrate is immersed in a bath containing a copper plating solution (e.g. Enplate 827 solutions from Cookson Electronic Materials) (Enplate is a Trade Mark) under suitable conditions to form conductive copper regions on the deposited palladium (e.g. 1 minute at 45° C.). Immersion in DMAB solution is optional: it has been found that copper regions will form on direct immersion of substrate with deposited palladium acetate in the Enplate copper bath, with this acting to reduce the palladium acetate to palladium.

The compositions may be printed onto a variety of substrates, and find particular use with non-porous and semi-porous substrates such as metals, plastics (e.g. polyesters such as polyethylene terephthalate (PET), polyethylene (PE), low density (LD) polyethylene, orientated polystyrene, high density (HD) polyethylene, polypropylene, polyvinyl chloride (PVC), polycarbonate, polyimide film etc), ceramics, natural materials, fabrics etc.

A substrate might be a material having thereon electrical components, such as conductive, semi-conductive, resistive, capacitive, inductive, or optical materials, such as liquid crystals, light emitting polymers or the like. The method may include the step of depositing one or more of said electrical components on the substrate, preferably by inkjet printing, prior to forming a conductive metal region on the resulting substrate.

Similarly, the method may further include the step of depositing an electrical component onto the resulting conductive metal region, building up complex devices. Said further deposition step may also be carried out using inkjet printing technology.

Optionally, the substrate is preheated before the activator composition is deposited thereon. This causes the activator composition to dry rapidly and spread less, achieving thinner lines.

For example, a Melinex polyester substrate (Melinex is a Trade Mark) was heated with air at 350° C. for 4 seconds using a hot air gun.

The method of the invention finds application in the formation of conductive metal regions on substrates, particularly in the selective formation of conductive metal layers, in a variety of different contexts and application, including electrical circuitry, antennas, conductors used in displays heater elements, interconnects and decorations. The invention includes within its scope an article including a solid layer prepared by the method of the invention.

The invention will be further described, by way of illustration, in the following examples.

EXAMPLES

In the Examples all quantities are % by weight unless otherwise specified.

UV curable activator compositions referred to as CIT103 (a) and CIT103 (b) were prepared according to the formulations shown in the Table below.

|  | Materials | CIT103 (a) | CIT103 (b) |
|---|---|---|---|
| Pd Solution | Palladium acetate | 1.03 | 1.09 |
|  | Ammonium hydroxide (28% aqueous solution) | 2.575 | 2.725 |
|  | Water | 6.695 | 7.085 |
| UV-Curable Solution | SR 494 | 1 | 1.1 |
|  | SR 415 | 3.6 | 3.8 |
|  | SR 344 | 7.3 | 7.7 |
|  | N-AM | 5.2 | 5.4 |
|  | N-VAM | 5.2 | — |
|  | EGMBE | 16.6 | 17.5 |
|  | NVP | — | — |
|  | NMP | — | — |
|  | IPA | 3.1 | 3.3 |
|  | Water | 44.4 | 46.8 |
|  | FC 4430 | 0.2 | 0.2 |
|  | Irgacure 2959 | 3.1 | 3.3 |
|  | Viscosity (mPa · s) at 25° C. | 5.73 | 5.33 |

The activator compositions were made by the following procedure.

To make the palladium complex solution, palladium acetate (as supplied from Johnson Matthey) was suspended in distilled water and stirred continuously in the absence of light while 28% ammonium hydroxide solution was added dropwise, maintaining the temperature below 35° C., using the quantities stated in the Table.

To make the UV-curable solution, the various oligomers and solvent components listed in the Table (in the stated amounts) were added to a flask in the order in which they appear in the Table, and stirred at room temperature for 30 minutes. The surfactant and photoinitiator were then added to the solution, and the resulting mixture was then stirred continuously to afford a pale yellow translucent solution.

The UV-curable solution and the palladium complex solution were mixed together to afford a pale orange translucent liquid, which was then filtered through a 1 µm GF-B glass fiber filter (Whatman) in the absence of light.

The resulting compositions were in the form of single phase aqueous compositions.

The compositions were syringed into HP45A print cartridges (43 ml), which were then sealed with a suitable ball bearing following the partial removal of air from within the cartridge.

Viscosity measurements were performed using a Brookfield DV-II+ viscometer operating with a rotational speed of 60 rpm at a temperature of 25° C. Briefly, 17.5 ml of the ink composition was transferred to the chamber, to which a suitable spindle was then lowered into the chamber and left until the temperature stabilized. Measurements were taken every 30, 60, 120 and 300 seconds, until a reproducible viscosity reading could be obtained.

The compositions were printed onto a range of substrates, including foil-lined cardboard, polyvinyl chloride (PVC), high density polyethylene (HDPE) and Melinex polyester substrate (Melinex is a Trade Mark of Dupont Teijin Films) at 600×600 dpi from a Wolke (Wolke is a Trade Mark) printer from the HP45A cartridges. The printed material was subjected to a pre-cure heating/erying step by exposure for 1 second to an infra red lamp (300 Watt bulb) and then cured by exposure to UV from a 500 Watt Fusion Light Hammer 6 system with an 'H' bulb, being conveyed below the IR lamp and UV system at a line speed of 20 m/min (5 passes). (Fusion Light Hammer 6 is a Trade Mark.) In some cases the substrates were post-heated at 60° C. for at least 1 hour.

Lines (with thicknesses from about 500 nm to about 1000 nm) with widths of 100 µm were printed to produce a variety of different features including solid blocks, thin lines, text and standard inkjet test images.

The printed substrates were immersed in a bath containing a 1.6% aqueous solution of dimethylamine borane (DMAB) at room temperature (about 25° C.) for 10-20 seconds to reduce the palladium acetate to palladium.

After washing in water, the substrates were subjected to an elecroless deposition process for deposition of copper metal on the palladium. This involved immersion in a commercial elecroless copper plating bath. The bath was made up of Enplate 827 copper plating component solutions A, B and C (Enplate is a Trade Mark from Cookson Electronic Materials). In particular, the electroless copper plating solution has the following composition:

|  | % (by weight) |
|---|---|
| Enplate 872 A | 10.713 |
| Enplate 872 B | 10.713 |
| Enplate 872 C | 3.571 |
| water | balance to 100% |

Enplate 872A contains copper sulphate, formaldehyde, complexing agent (Quadrol) and water; Enplate 872B contains a complexing agent (Quadrol), and water; Enplate 872 C contains potassium cyanide, sodium hydroxide, and water. Quadrol is a Trade Mark. Quadrol is N, N, N', N'—Tetrakis (2-hydroxypropyl) ethylenediamine. The bath was maintained at a temperature of 45° C., and the substrates were immersed in the bath for 1 minute. This resulted in deposition of conductive copper regions on the palladium.

The adhesion of the copper regions to Melinex substrate was tested by the 3M tape test (3M is a Trade Mark). This involved applying a piece of 3M 616 tape with firm pressure. After waiting 1 minute the tape was removed and the % copper removal recorded.

With CIT 103(b) (which lacks N-VAM) near complete removal of copper was evident by the 3M 616 tape test, whereas with CIT 103(a) little or no copper removal was observed.

N-VAM has beneficial properties in the activator composition. It functions as a low-viscosity, curable humectant so aiding jetting stability and printing reliability, as well as preventing drying of the nozzles. N-VAM is also useful from the point of being cured-in with the oligomers to increase film thickness, and being able to function as a co-solvent. Interestingly, it has surprisingly been found to be an effective anti-kogation agent.

Removing N-VAM from the ink formulation to give CIT103 (b) appears to impact on the adhesion properties of this ink composition, resulting in poorer quality copper plating, regardless of whether the activator film was heated (60° C. for 1 hour) before or after U curing as shown by the 3M tape test.

The continued print lifetimes of CIT103 (a) and CIT103 (b) were also compared.

The printing reliability of both CIT103 (a) and CIT103 (b) were assessed by monitoring the print quality at regular intervals through the lifetime (43 ml) of the print cartridge. Here, print tests were performed at 0% and 100% ink usage on Melinex substrates, after twice refilling the cartridges. It was observed that the prolonged printing (i.e. two cartridges) of both CIT103 (a) and CIT103 (b) had little effect on the quality of the printed image, indicating that the absence of N-VAM [i.e. CIT103 (b)] has negligible effect on the print quality over the complete lifetime of the cartridge. This implies that the combined presence of N-acryloyl morpholine (N-AM) and ethylene glycol monobutyl ether (EGMBE) as humectants is sufficient to prevent drying of the print nozzles over the practicable lifetime of the print cartridge. Indeed, staggered (i.e. occasional) printing from these same cartridges loaded with either CIT103 (a) or CIT103 (b) over a period of two weeks demonstrated a satisfactory print quality every time, indicating excellent ink stability. Printing with CIT103 (b) after refilling the cartridge for a third time however, saw a partial reduction in the print quality, and a noticeable reduction in the jetting performance, ultimately resulting in a complete failure to print altogether. With CIT103 (a), the print results were comparable to CIT103 (b), although printing could be restarted after cleaning the head.

From these results, one can surmise that of the two ink formulations tested [CIT103 (a) and CIT103 (b)], the best print quality was achieved with CIT103 (a), providing the UV-cured (5 passes at 20 m/min) Melinex substrates were post heated at 60° C. for at least 1 hour. With regards to ink stability, both formulations demonstrated good jetting and printing at least till the $2^{nd}$ refill.

In conclusion, the presence of an anti-kogation agent (i.e. N-VAM) extends the lifetime over which a cartridge will give good print performance. From this study, the formulation CIT103 (a) is deemed the preferred formulation for printing on Melinex. With regards to the print quality and stability on other substrates, e.g. foil, PVC, HDPE, again CIT103 (a) demonstrated the better results.

The invention claimed is:

1. An activator composition that activates a chemical reaction that forms a conductive transition metal region on a substrate, the composition being suitable for inkjet printing, the composition comprising
   a single phase aqueous composition including one or more curable materials and one or more co-solvents for the curable material(s); and
   a conductive transition metal region forming activator,
   wherein the activator is a salt of a transitional metal
   wherein the curable materials include one or more curable oligomers,
   wherein the curable oligomers include at least one alkoxylated trimethyolpropane acrylate, and
   wherein the composition comprises water in an amount of at least 35% by weight.
2. The composition according to claim 1, wherein the alkoxylated trimethylolpropane acrylate oligomer comprises a tri(meth)acrylate.
3. The composition according to claim 2, wherein the alkoxylated trimethylolpropane acrylate oligomer comprises ethoxylated trimethylolpropane triacrylate.
4. The composition according to claim 3, wherein the alkoxylated trimethylolpropane acrylate oligomer further comprises ethoxylated pentaerythritol tetraacrylate.
5. The composition according to claim 4, wherein the curable materials include at least one polyalkylene glycol acrylate oligomer.
6. The composition according to claim 5, wherein the polyalkene glycol acrylate oligomer comprises polyethylene glycol diacrylate.
7. The composition according to claim 1, wherein the curable materials include one or more curable monomers.
8. The composition according to claim 7, wherein the curable monomers comprise an n-vinyl monomer material.
9. The composition according to claim 8, wherein the curable monomers comprise n-vinyl acetamide.
10. The composition according to claim 9, wherein the curable monomers comprise n-vinyl acetamide in the absence of n-vinyl pyrrolidone.
11. The composition according to claim 10, wherein the curable monomers comprise n-vinyl acetamide and n-acryloyl morpholine.
12. The composition according to claim 1, wherein the co-solvent is a water-soluble organic solvent.
13. The composition according to claim 12, wherein the co-solvent comprises a glycol ether.
14. A composition according to claim 1, wherein the activator is palladium acetate.
15. A method of printing, comprising thermally inkjet printing a composition in accordance with claim 1 onto a substrate.
16. A method of forming a conductive metal region on a substrate, comprising thermally inkjet printing a composition of claim 1 onto a substrate to produce an activator-containing region on the substrate; and applying one or more liquids to the region for chemical reaction, activated by the activator, to form a conductive metal region on the substrate.
17. The method according to claim 16, wherein the curable materials are caused or allowed to cure prior to application of the one or more liquids.
18. The method according to claim 16 or 17, wherein the one or liquids include metal ions and reducing agent.
19. The method according to claim 18, wherein the liquids are applied by immersion.
20. The composition according to claim 13, wherein the co-solvent comprises ethylene glycol monobutyl ether.

* * * * *